(12) United States Patent
Uehara et al.

(10) Patent No.: US 11,282,732 B2
(45) Date of Patent: Mar. 22, 2022

(54) SYSTEM AND METHOD FOR CLAMPING A WORK PIECE

(71) Applicant: Trek, Inc., Lockport, NY (US)

(72) Inventors: Toshio Uehara, Tokyo (JP); Peter McAnn, Medina, NY (US); Donnie Herman, Niagara Falls, NY (US)

(73) Assignee: Trek, Inc., Lockport, NY (US)

( * ) Notice: Subject to any disclaimer, the term of this patent is extended or adjusted under 35 U.S.C. 154(b) by 91 days.

(21) Appl. No.: 15/323,920

(22) PCT Filed: Feb. 9, 2015

(86) PCT No.: PCT/US2015/015078
§ 371 (c)(1),
(2) Date: Jan. 4, 2017

(87) PCT Pub. No.: WO2015/120419
PCT Pub. Date: Aug. 13, 2015

(65) Prior Publication Data
US 2017/0162415 A1 Jun. 8, 2017

Related U.S. Application Data

(60) Provisional application No. 61/937,050, filed on Feb. 7, 2014.

(51) Int. Cl.
*H01L 21/683* (2006.01)
*H01G 7/02* (2006.01)

(52) U.S. Cl.
CPC .......... *H01L 21/6833* (2013.01); *H01G 7/02* (2013.01)

(58) Field of Classification Search
CPC .... H01L 21/6831; H01L 21/6833; H01G 7/02
See application file for complete search history.

(56) References Cited

U.S. PATENT DOCUMENTS

| 5,436,790 A | 7/1995 | Blake et al. |
| 5,452,177 A | 9/1995 | Frutiger |
| 5,485,099 A | 1/1996 | Collins et al. |

(Continued)

FOREIGN PATENT DOCUMENTS

| CN | 1224544 A | 7/1999 |
| CN | 102081362 A | 6/2011 |

(Continued)

OTHER PUBLICATIONS

Written Opinion of the International Searching Authority and International Search Report for International Application No. PCT/US2015/15078.*

(Continued)

*Primary Examiner* — Christopher J Besler
(74) *Attorney, Agent, or Firm* — Hodgson Russ LLP

(57) ABSTRACT

A clamping system and a method of clamping a work piece are disclosed. The clamping system has an electrostatic clamp and a high-impedance voltmeter ("HIV"). The electro-static clamp may include a platen and a plurality of electrodes embedded in the platen. In use, at least some of the embedded electrodes provide one side of a capacitor and a work piece provides another side of the capacitor in order to hold the work piece relative to the platen when at least some of the embedded electrodes are electrically charged. The HIV is electrically connected to at least some of the embedded electrodes.

3 Claims, 4 Drawing Sheets

(56) References Cited

U.S. PATENT DOCUMENTS

| | | |
|---|---|---|
| 5,563,798 A | 10/1996 | Berken et al. |
| 5,708,250 A | 1/1998 | Benjamin et al. |
| 5,793,192 A | 8/1998 | Kubly et al. |
| 6,075,375 A | 6/2000 | Burkhart et al. |
| 6,097,492 A | 8/2000 | Kondo et al. |
| 6,198,616 B1 | 3/2001 | Dahimene et al. |
| 6,215,643 B1 | 4/2001 | Nagasaki |
| 6,267,839 B1 | 7/2001 | Shamouilian et al. |
| 6,377,060 B1 | 4/2002 | Burkhart et al. |
| 6,388,861 B1 | 5/2002 | Frutiger |
| 6,741,446 B2 | 5/2004 | Ennis |
| 7,072,166 B2 | 7/2006 | Qin et al. |
| 2001/0018098 A1 | 8/2001 | Sun et al. |
| 2002/0159216 A1 | 10/2002 | Ennis |
| 2003/0038114 A1 | 2/2003 | Howald |
| 2006/0023393 A1 | 2/2006 | Poh |
| 2010/0271744 A1 | 10/2010 | Ni et al. |
| 2011/0032654 A1 | 2/2011 | Mcann et al. |

FOREIGN PATENT DOCUMENTS

| | | |
|---|---|---|
| GB | 2293689 A | 4/1996 |
| JP | H03261776 A | 11/1991 |
| JP | H04162443 A | 6/1992 |
| JP | H05299354 A | 11/1993 |
| JP | H07086384 A | 3/1995 |
| JP | H08191099 A | 7/1996 |
| JP | H09213778 A | 8/1997 |
| JP | H1167885 A | 3/1999 |
| JP | 2002305237 A | 10/2002 |
| JP | 2008032661 A | 2/2008 |
| JP | 2008047564 A | 2/2008 |
| JP | 2011014641 A | 1/2011 |
| JP | 2011061048 A | 3/2011 |
| JP | 5261852 B2 | 8/2013 |
| KR | 20050056757 A | 6/2005 |
| KR | 20090068055 A | 6/2009 |

OTHER PUBLICATIONS

Machine Translation of JP H09-213778 (Year: 1997).*
Machine translation of JP 2002-305237 A (Year: 2002).*
Machine translation of Japanese Patent Publication No. JP H04-162443 A (Year: 1992).*

* cited by examiner

SYSTEM AND METHOD FOR CLAMPING A WORK PIECE

CROSS-REFERENCE TO RELATED APPLICATION

This application claims the benefit of priority to U.S. provisional patent application Ser. No. 61/937,050, filed on Feb. 7, 2014. The contents of the provisional patent application are incorporated herein by this reference.

FIELD OF THE INVENTION

The present invention relates to electrostatic clamps.

BACKGROUND OF THE INVENTION

Electrostatic clamps are used in the semiconductor industry to firmly hold a silicon wafer while various processes are performed on the wafer. Relative to mechanical clamps, electrostatic clamps have significant advantages, which include (a) an increased ability to transfer heat, (b) a reduction in mechanical wear on the wafer, (c) an increase in the effective area of the wafer that may be used to produce saleable products, (d) a decrease in the number of particulates generated, (e) reduced contamination of the clamp from an ion beam used in sputtering, and (f) uniformity of the clamping force across the surface of the wafer.

The semiconductor industry is not the only industry which uses electrostatic clamps. For example, liquid crystal display manufacturers use electrostatic clamping techniques to hold special glass during processing. Also, solar cell manufacturers use electrostatic clamps.

An electrostatic clamp holds a work piece (e.g. semiconductor wafer, glass or other object being worked on) by creating a capacitor. In order that the work piece can be held to the electrostatic clamp, all or part of the work piece is conductive. For example, a portion of the work piece may be non-conductive, but a conductive plating may be added to the non-conductive portion of the work piece before clamping occurs. In a simple electrostatic clamp, the work piece becomes an electrode of the capacitor, and a conductive portion of the clamp provides the other electrode of the capacitor. If the clamp has only a single electrode, then the work piece must have an electrical connection to ground, typically via a conductor or ionized gas. When the clamp electrodes are charged, the work piece is attracted to the clamp electrode. The clamping force can be calculated using Coulomb's law.

The electrostatic clamp provides a thin layer of material between the clamp electrodes and the work piece. In this document, the material provided by the electrostatic clamp that resides between the clamp electrode(s) and the work piece is called the "barrier material". Typically, the thickness of the barrier material is on the order of tens to hundreds of microns. Depending on the electrostatic clamp technology, the barrier material can be either a pure dielectric (in the case of a Coulombic clamp) or a semi-insulative material (in the case of a Johnsen-Rahbek clamp).

In more complex electrostatic clamps, the clamp has more than one electrode. In the case of a clamp that has two electrodes (a.k.a. a bi-polar clamp), the charge on a first one of the clamp electrodes is opposite in polarity to the charge on a second one of the electrodes. This arrangement forms a capacitance from one clamp electrode, through the barrier material, to the work piece, back through the barrier material and then to the other clamp electrode. Electrostatic clamps having more than two electrodes are a variation on the bi-polar clamp, but operate in a manner that is similar to the bi-polar clamp.

For a variety of reasons, it is desirable to monitor the work piece, especially while processes are being performed on the work piece. For example, it is desirable to know how much voltage is being applied to the work piece. Prior art devices for monitoring the voltage being applied to the work piece require conductive contacts to touch the work piece, and these contacts may damage the work piece during processing. Therefore, it would be beneficial if the voltage being applied to a work piece can be determined without physically contacting the work piece with a conductive contact.

SUMMARY OF THE INVENTION

The invention may be embodied as a clamping system having an electrostatic clamp and a high-impedance voltmeter ("HIV"). The electrostatic clamp may include a platen and a plurality of electrodes embedded in the platen (the "embedded electrodes"). At least some of the electrodes provide one side of a capacitor, and a work piece provides another side of the capacitor in order to hold the work piece to the platen when at least some of the embedded electrodes are electrically charged. A dielectric material or a semi-insulative material resides between the embedded electrodes and the work piece. The HIV is electrically connected to at least some of the embedded electrodes, and may have an impedance equal to or exceeding $10^{16}$ ohms.

In some embodiments of the invention, some of the embedded electrodes may not be electrically connected to the HIV. In these embodiments, the primary purpose of such electrodes (those that are not connected to the HIV) is clamping. Others of the embedded electrodes are electrically connected to the HIV, and the primary purpose of these electrodes is to measure the voltage of the work piece. In one embodiment of the invention, the electrodes that are not electrically connected to the HIV are larger than the electrodes that are electrically connected to the HIV.

In one method that is in keeping with the invention, a work piece is clamped relative to a platen of an electrostatic clamp. A plurality of electrodes are embedded in the platen. A high-impedance voltmeter is provided such that it is electrically connected to at least some of the embedded electrodes. A work piece is placed near the platen (usually so that the work piece is supported by the platen), and at least some of the embedded electrodes are caused to be electrically charged so that these embedded electrodes provide one side of a capacitor and the work piece provides another side of the capacitor in order to hold the work piece relative to the platen. Voltages of at least some of the electrodes are monitored using the HIV. Conditions (such as a voltage) being applied to the work piece may be adjusted as a result of or in response to the monitored voltages of at least some of the embedded electrodes.

BRIEF DESCRIPTION OF THE DRAWINGS

For a fuller understanding of the nature and objects of the invention, reference should be made to the accompanying drawings and the subsequent description. Briefly, the drawings are.

FURTHER DESCRIPTION OF THE INVENTION

Figure 1:
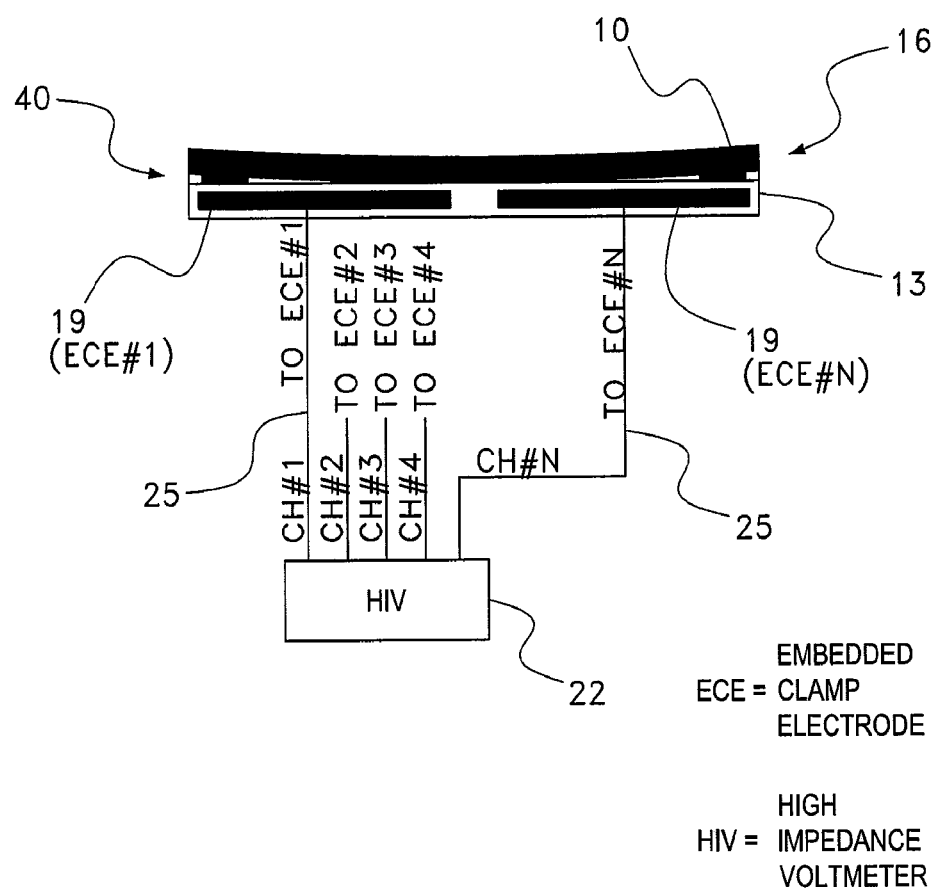
FIG. 1 is a schematic of a system according to the invention.

FIG. 1 is a schematic representation of a system according to the invention. In FIG. 1 there is shown a work piece 10 in the form of a silicon wafer that is clamped relative to a platen 13 of an electrostatic clamp 16. Two of the embedded clamp electrodes 19 (ECE#1 and ECE#N) are shown embedded in this particular platen 13. However, the invention is not limited to two ECEs 19, and FIG. 1 suggests there may be at least five ECEs 19. Together with the work piece 10, the ECEs 19 form a "capacitor", and the attractive force developed between the work piece 10 and the ECEs 19 holds the work piece 10 firmly to the platen 13.

A high impedance voltmeter 22 ("HIV") is electrically connected via conductors 25 to the ECEs 19 in order to monitor the voltage of the ECEs 19. The high impedance of the HIV 22 prevents the HIV 22 from having a meaningful influence on the clamping ability of the ECEs 19, and thus the ECEs 19 can continue to serve as one side of the "capacitor" that results in the work piece 10 being clamped relative to the platen 13. It is believed that an HIV 22 having an impedance of $10^{16}$ ohms or higher will be well suited, but other impedances may also be suitable. An HIV 22 that may be used for this purpose is the Model 800 Ultra-High Impedance Voltmeter produced by Trek, Inc. of Lockport, N.Y.

In the example shown in FIG. 1, five channels of the HIV 22 are shown. Each of the channels may be used to monitor a different ECE 19, and therefore monitor a different voltage. It should be noted that the invention is not limited to an HIV 22 having five channels. An HIV may have a single channel or multiple channels. Two of the five channels shown in FIG. 1 are each shown being used to measure the voltage of a different one of the ECEs 19. In the arrangement shown in FIG. 1, Channel #1 ("CH#1") monitors the voltage of the first ECE 19, and Channel #2 ("CH#2") monitors the voltage of the second ECE 19.

By monitoring the voltage of the ECEs 19, the voltage applied to the work piece 10 can be monitored. Such a monitoring process can be accomplished in very harsh environments where (for example) the voltage being applied to the work piece 10 originates from a plasma shower, ion implantation, or other voltage source. Furthermore, there is no need to introduce a conductive contact to the work piece, thereby eliminating the risk of damaging the work piece 10 as a result of contacting the work piece 10. In addition, by monitoring the voltage of the work piece 10 via the ECEs 19, it is possible to sense when a work piece has been made available for clamping. Finally, such a monitoring system can be retrofitted to existing electrostatic clamps, or easily added as a feature to new electrostatic clamps.

Figure 2:
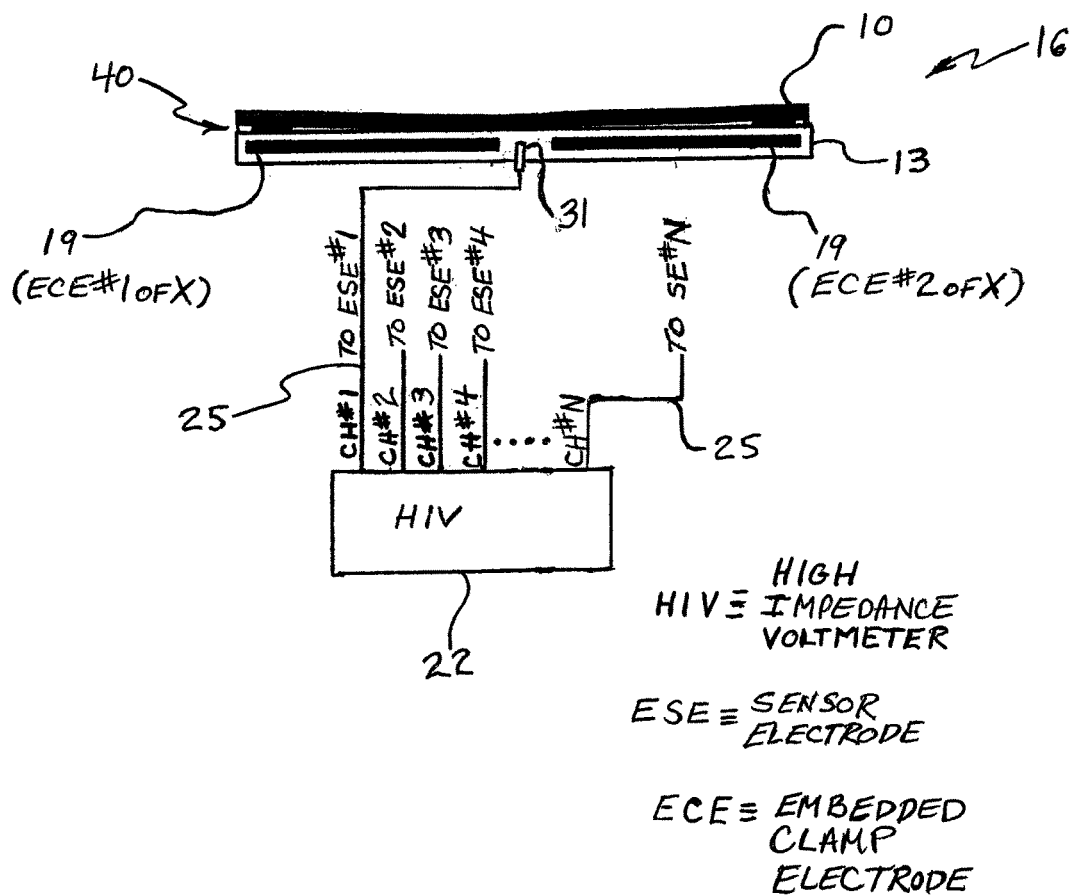
FIG. 2 is a schematic of another system according to the invention.

FIG. 2 is a schematic representation of a different system that is in keeping with the invention. In FIG. 2, the relatively large embedded clamp electrodes 19 are provided for clamping the work piece 10 to the platen 13, and smaller sensor electrodes 31 ("ESE") are embedded in the platen 13. Although the ESEs 31 contribute to the clamping force, their primary role is to provide a location for measuring voltage. As such, the system depicted in FIG. 2 has some embedded electrodes that are not monitored for voltage (the ECEs 19), and these are relatively large by comparison to the embedded electrodes that are monitored for voltage (the ESEs 31).

An embedded electrode that is monitored for purposes of determining the voltage of the work piece is referred to below as a "monitored embedded electrode", or "MEE" for short. Consequently, the ECEs 19 of FIG. 1 are MEEs. The ESEs 31 of FIG. 2 are MEEs, but the ECEs 19 of FIG. 2 are not MEEs.

Figure 3:
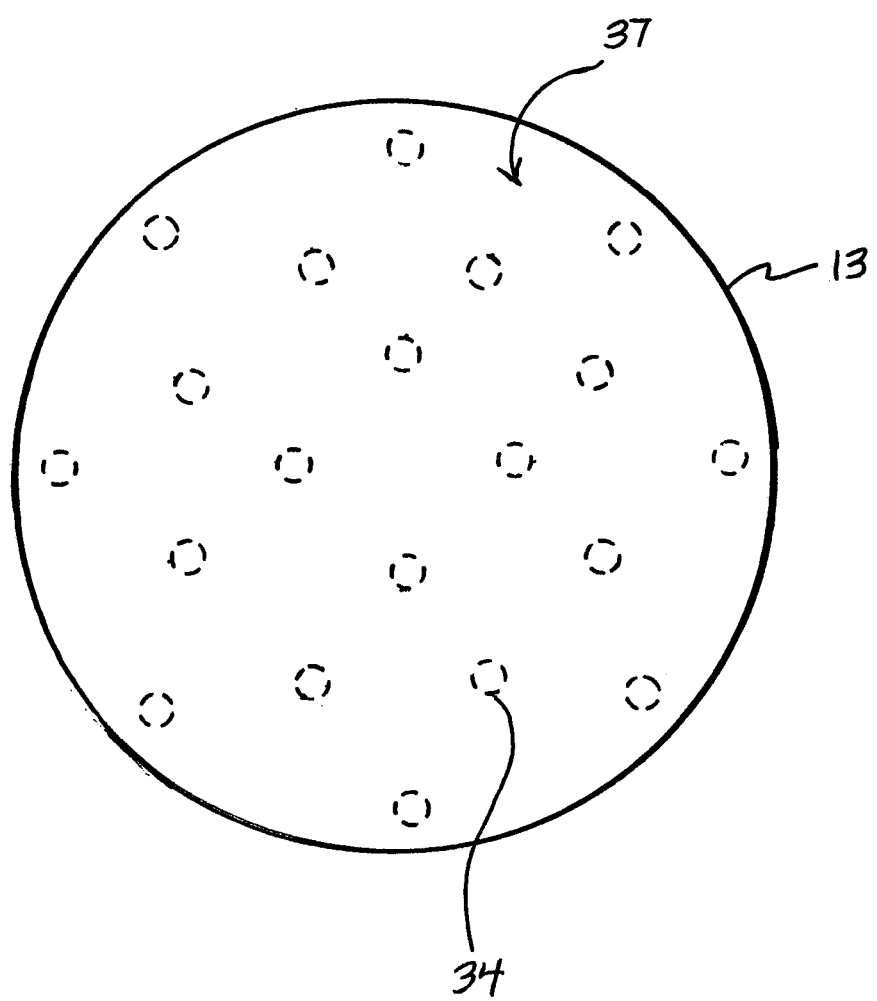
FIG. 3 is a plan view of a platen according to the invention.

FIG. 3 is a plan view of a platen that is in keeping with the embodiment of the invention depicted in FIG. 2. In FIG. 3, the MEEs 34 are depicted in dashed lines to reflect the fact that the MEEs 34 are embedded in the platen 13.

MEEs, which are conductively connected to the HIV 22, may be embedded approximately 100 micrometers from an outer surface 37 of the platen 13 that is closest to the work piece 10. In such an arrangement, the MEEs can be used to detect when a work piece 10 is placed in position for clamping (i.e. the work piece 10 is supported by but not clamped relative to the platen 13). With no voltage applied to the work piece 10, the voltage on MEEs goes to zero when a work piece 10 is placed in position (relative to the platen 13) for clamping. As such, the MEEs may be used to detect when a work piece 10 is ready to be clamped. Once a clamping voltage is applied, the MEEs are well positioned to measure voltages from 0 volts to +/−3000 volts that are applied to the work piece 10. In some embodiments, the voltage measured by the MEEs may exceed +/−3000 volts. The difference between the actual voltage of the work piece 10 and the voltage measured by the MEEs may be less than 100 millivolts.

When the MEEs are very close to the platen surface 37 that is nearest to the work piece 10, the difference between the actual and the measured voltage will likely be less than when the MEEs are further from the platen surface 37. It is believed that an electrode-to-platen surface distance that is greater than 100 micrometers may be utilized. For example, it is believed that a sensor-to-platen surface distance of 1 millimeter will provide accurate voltage measurements, but some compensating measures may be needed at that distance. For example, a voltage offset may be employed and/or a time delay may need to be recognized. In those instances, the measured voltage may be augmented by the offset in order to provide a voltage measurement that is close to the actual voltage, and/or the measured voltage may be temporally advanced in order to more closely indicate the actual voltage with respect to a particular time.

The output of the HIV 22 may drift without periodically calibrating the HIV 22. As such, sensing of the voltages of the MEEs by the HIV 22 may be briefly interrupted from time to time in order to provide the HIV 22 with a known voltage (e.g. 0 Volts) in order to calibrate the HIV 22. Once calibrated, the HIV 22 would again measure the voltages of the MEEs.

Figure 4:
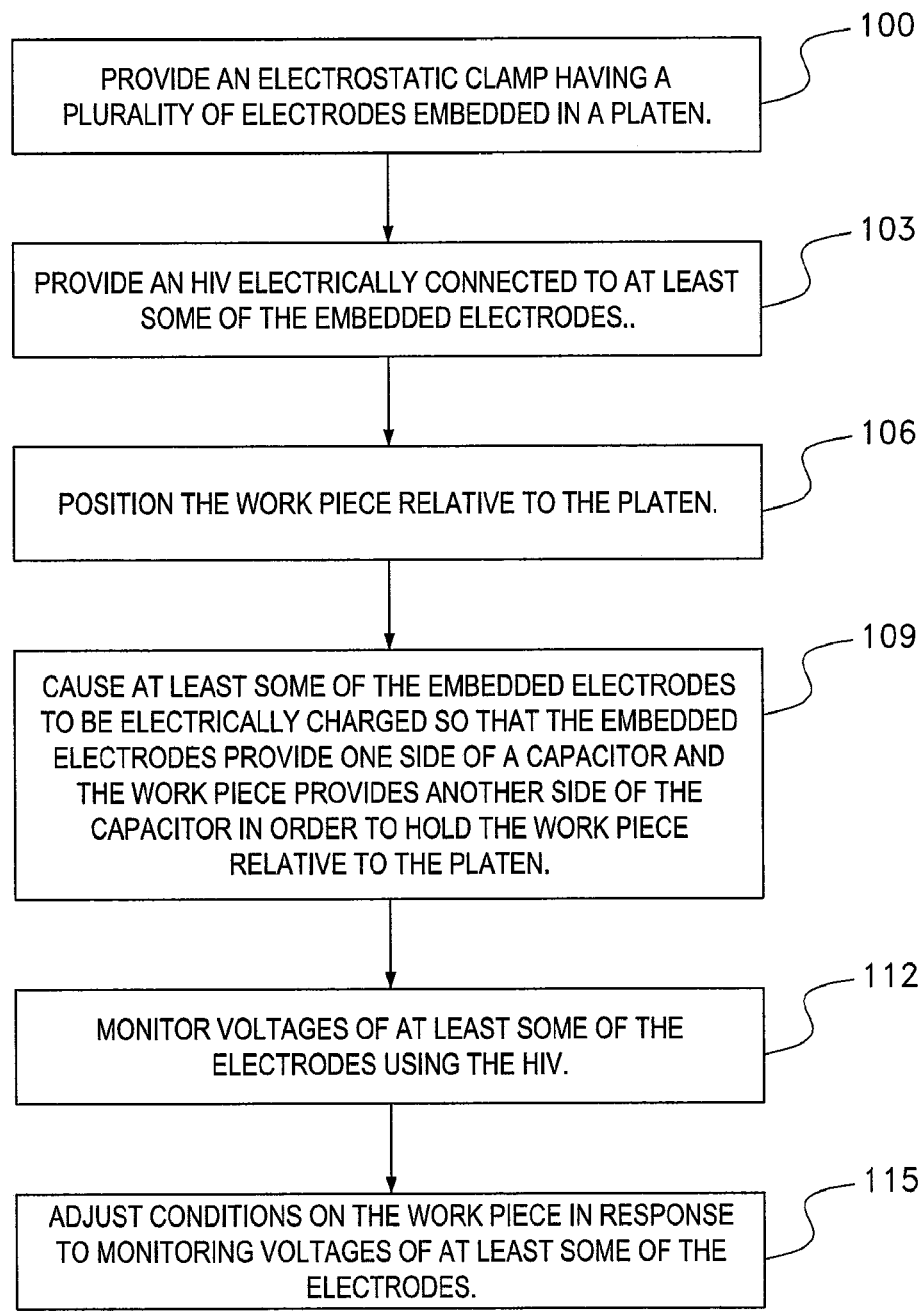
FIG. 4 is a flow diagram depicting a method according to the invention.

From the description above, it will now be recognized that that platen 13, with its embedded electrodes, and that HIV 22 may be used to monitor the voltage of the work piece 10 and that such monitoring may be used to alter the conditions of the work piece 10 so that the voltage of the work piece 10 remains in a desired range. FIG. 4 illustrates one such method. In the method illustrated in FIG. 4, an electrostatic clamp is provided 100. That clamp may have a platen 13 and a plurality of electrodes embedded in the platen 13. An HIV 22 may be provided 103 such that the HIV 22 is electrically connected via electrical conductors 25 to at least some of the embedded electrodes. The work piece 10 is positioned 106 so that a dielectric or semi-insulative material 40 resides between the work piece 10 and the platen 13, and so that the work piece 10 is supported by the platen 13. At least some of the embedded electrodes are then caused to be electrically charged 109 so that the embedded electrodes provide one side of a capacitor and the work piece 10 provides another side of the capacitor, and the work piece 10 is thereby held relative to the platen 13. Voltages of at least some of the embedded electrodes are monitored 112 using the HIV 22, and conditions on the work piece 10 may be adjusted 115 in response to monitoring voltages of at least some of the electrodes.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A clamping and monitoring system, comprising:
   an electrostatic clamp having a platen and a plurality of electrodes ("embedded electrodes") embedded in the platen such that the embedded electrodes are spaced apart from an outer surface of the platen that is closest to a workpiece position so as to create an electrode-to-platen-surface-distance of 1 mm or less, wherein the embedded electrodes are capable of providing one side of a capacitor and a work piece is capable of providing another side of the capacitor in order to hold the work piece to the platen when at least some of the embedded electrodes are electrically charged; and
   a high-impedance voltmeter (the "HIV") electrically connected to at least one of the embedded electrodes to measure an induced voltage arising from a voltage directly applied to the work piece in order to monitor a process that applies the voltage directly applied to the work piece, wherein the HIV has an impedance equal to or exceeding $10^{16}$ Ohms.

2. The clamping and monitoring system of claim 1, wherein at least some of the embedded electrodes are not electrically connected to the HIV.

3. The clamping and monitoring system of claim 2, wherein the embedded electrodes that are not electrically connected to the HIV are larger than the embedded electrodes that are electrically connected to the HIV.

\* \* \* \* \*